(12) United States Patent
Bhattacharyya

(10) Patent No.: US 6,998,667 B2
(45) Date of Patent: Feb. 14, 2006

(54) SCALABLE GATE AND STORAGE DIELECTRIC

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 10/377,904

(22) Filed: Feb. 27, 2003

(65) Prior Publication Data
US 2003/0160277 A1    Aug. 28, 2003

Related U.S. Application Data

(62) Division of application No. 10/037,081, filed on Nov. 9, 2001, now Pat. No. 6,743,681.

(51) Int. Cl.
H01L 27/108    (2006.01)

(52) U.S. Cl. ............... 257/310; 257/410; 257/411; 438/216; 438/287; 438/591

(58) Field of Classification Search ............... 257/310, 257/410, 411; 438/216, 240, 261, 287, 591 438/778, 786
See application file for complete search history.

(56) References Cited

U.S. PATENT DOCUMENTS

| | | | | |
|---|---|---|---|---|
| 4,566,173 | A * | 1/1986 | Gossler et al. | 438/762 |
| 4,870,470 | A * | 9/1989 | Bass et al. | 257/324 |
| 6,207,589 | B1 * | 3/2001 | Ma et al. | 438/785 |
| 6,245,606 | B1 | 6/2001 | Wilk et al. | 438/216 |
| 6,368,919 | B1 * | 4/2002 | Nuttall et al. | 438/261 |
| 6,391,724 | B1 * | 5/2002 | Park | 438/279 |
| 6,417,570 | B1 | 7/2002 | Ma et al. | 257/760 |
| 6,444,545 | B1 * | 9/2002 | Sadd et al. | 438/503 |
| 6,445,030 | B1 * | 9/2002 | Wu et al. | 257/315 |
| 6,492,283 | B1 | 12/2002 | Raaijmakers et al. | 438/770 |
| 6,521,945 | B1 * | 2/2003 | Nuttall et al. | 257/324 |
| 6,559,014 | B1 * | 5/2003 | Jeon | 438/287 |
| 6,579,767 | B1 * | 6/2003 | Park et al. | 438/287 |
| 6,586,349 | B1 * | 7/2003 | Jeon et al. | 438/785 |
| 6,617,639 | B1 * | 9/2003 | Wang et al. | 257/324 |
| 6,642,573 | B1 * | 11/2003 | Halliyal et al. | 257/316 |
| 6,645,882 | B1 * | 11/2003 | Halliyal et al. | 438/785 |
| 6,700,771 | B1 * | 3/2004 | Bhattacharyya | 361/311 |
| 2002/0190302 | A1 * | 12/2002 | Bojarczuk et al. | 257/310 |

OTHER PUBLICATIONS

U.S. Appl. No. 09/944,986, filed Aug. 30, 2001, Bhattacharyya.

J. H. Lee et al., "Effect of Polysilicon Gate on the Flatband Voltage Shift and Mobility Degradation for ALD-AL2O3 Gate Dielectric," IEDM Technical Digest, San Francisco, Dec. 10-13, 2000, pp. 645-648.

(Continued)

Primary Examiner—Tom Thomas
Assistant Examiner—José R. Diaz
(74) Attorney, Agent, or Firm—Fish & Neave IP Group of Ropes & Gray LLP

(57) ABSTRACT

Gate and storage dielectric systems and methods of their fabrication are presented. A passivated overlayer deposited between a layer of dielectric material and a gate or first storage plate maintains a high K (dielectric constant) value of the dielectric material. The high K dielectric material forms an improved interface with a substrate or second plate. This improves dielectric system reliability and uniformity and permits greater scalability, dielectric interface compatibility, structural stability, charge control, and stoichiometric reproducibility. Furthermore, etch selectivity, low leakage current, uniform dielectric breakdown, and improved high temperature chemical passivity also result.

74 Claims, 9 Drawing Sheets

OTHER PUBLICATIONS

L. Manchanda et al., "Si-Doped Aluminates for High Temperature Metal-Gate CMOS: Zr-Al-Si-O, A Novel Gate Dielectric for Low Power Applications," IEDM Technical Digest, San Francisco, Dec. 10-13, 2000, pp. 23-26.

A. Bhattacharyya et al., "Physical and Electrical Characteristics of LPCVD Silicon Rich Nitride," ECS Digest, New Orleans, 1984.

D. A. Buchanan et al., "80 nm poly-silicon gated n-FETs with ultra-thin Al2O3 gate dielectric for ULSI applications," IEDM Technical Digest, San Francisco, Dec. 10-13, 2000, pp. 223-226.

Byoung Hun Lee et al., "Ultrathin Hafnium Oxide with Low Leakage and Excellent Reliability for Alternate Gate Dielectric Application," IEDM Technical Digest, Washington DC, Dec. 5-8, 1999, pp. 133-136.

Wen-Jie Qi et al., "MOSCAP and MOSFET characteristics using ZrO2 gate dielectric deposited directly on Si," IEDM Technical Digest, Dec. 5-8, 1999, pp. 145-148.

H. F. Luan et al., "High Quality Ta2O5 Gate Dielectric with Tox,eq < 10A," IEDM Technical Digest, Dec. 5-8, 1999, pp. 141-144.

K. Hieda et al., "Low Temperature (Ba, Sr) TiO3 Capacitor Process Integration (LTB) Technology for Gigabit Scaled DRAMs," IEDM Technical Digest, Dec. 5-8, 1999, pp. 789-792.

G. B. Alers et al., "Advanced Amorphous Dielectrics for Embedded Capacitors," IEDM Technical Digest, Dec. 5-8, 1999, pp. 797-800.

Xin Guo et al., "High Quality Ultra-thin (1.5 nm) TiO2/Si3N4 Gate Dielectric for Deep Sub-micron CMOS Technology," IEDM Technical Digest, Dec. 5-8, 1999, pp. 137-140.

H.-J. Gossman et al., "Doping of Si thin films by low-temperature molecular beam epitaxy," J. Appl. Phys. 73, Jun. 16, 1993, pp. 8237-8241.

J. Wolcik et al., "Characterization of Silicon Oxynitride Thin Films Deposited by ECR-PECVD," Tenth Canadian Semiconductor Technology Conference, Ottawa, Canada, Aug. 13-17, 2001, p. 184.

Adrian J. Devasahayam et al., "Material Properties of Ion Beam Deposited Oxides for the Opto-Electronic Industry," Tenth Canadian Semiconductor Technology Conference, Ottawa, Canada, Aug. 13-17, 2001, p. 185.

* cited by examiner

SCALABLE GATE AND STORAGE DIELECTRIC

This is a divisional of U.S. patent application Ser. No. 10/037,081, filed Nov. 9, 2001 now U.S. Pat. No. 6,743,681.

BACKGROUND OF THE INVENTION

This invention relates to gate and storage dielectrics of integrated circuit devices. More particularly, this invention relates to scalable gate and storage dielectric systems.

A dielectric is an insulating material capable of storing electric charge and associated energy by means of a shift in the relative positions of internally bound positive and negative charges known as charge dipoles. This shift is brought about by an external electric field. A dielectric system is a collaborating arrangement of materials including at least one dielectric material.

Dielectric systems are directly involved in the progress of microelectronic process technology. Successes in the manufacture of quality dielectric systems have done much to advance integrated circuit technology. Improved dielectric systems have traditionally resulted in significant increases in electronic device and system capabilities.

The quality of a dielectric system can be determined generally by a well-defined criteria. One criterion is the effective dielectric constant K of the system. The effective dielectric constant is dependent on the individual dielectric constants of the materials used in the system. A dielectric constant indicates the relative capacity, as compared to a vacuum where K=1, of the material to store charge. Thus, high dielectric constant materials advantageously produce dielectric systems with high capacity to store charge.

Another criterion is the scalability of the system. Scalability of a dielectric system refers to its physical size (i.e., its thickness, measured in nanometers, and area). In particular, the ability to minimize the size of the system is important. Note that a system's thickness and area can each be scaled independently of the other. A dielectric system having a geometrically scalable thickness may allow higher charge storage capacity. A dielectric system having a geometrically scalable area may allow more transistors to be fabricated on a single integrated circuit chip, thus allowing increased functionality of that chip.

Additional criteria for determining the quality of a dielectric system are dielectric interface compatibility and high temperature structural stability. In order to produce a stable and reliable device, a dielectric must be chemically compatible with the semiconductor substrate or plate material with which the dielectric forms an interface. The substrate or plate material is usually silicon. In addition, the substrate and dielectric interface must remain stable over a range of temperatures.

Other criteria are a dielectric system's ability to provide charge control and stoichiometric reproducibility at a substrate/dielectric or plate/dielectric interface. Uncontrollable bonding at an interface may decrease device reliability and cause inconsistent device characteristics from one device to another. Dangling atoms (i.e., atoms that have not formed bonds) from the dielectric material may contribute to an undesirable charge accumulation at the interface. Charge accumulation varying from device to device can lead to an undesirably varying threshold voltage from device to device. The threshold voltage can be defined as the minimum voltage applied to a gate electrode of a device that places the device in active mode of operation.

In addition, leakage characteristics of a dielectric material are particularly important when the dielectric material is used in scaled down devices. A thin gate dielectric often gives rise to an undesirable tunneling current between a gate and the substrate. Tunneling current results in wasted power and is particularly destructive in memory circuitry, in which capacitors coupled to a gate dielectric system may be undesirably discharged by the tunneling (i.e., leakage) current.

High temperature chemical passivity is also an important criterion of a dielectric system. A gate dopant may undesirably diffuse through a gate dielectric material during high temperature device fabrication, corrupting the substrate/dielectric or plate/dielectric interface. The dopant may form bonds with the dielectric material and the substrate or plate material causing an undesirable negative charge buildup at the interface. This negative charge may also result in an undesirable increase in the threshold voltage of the device.

Further, the quality of a dielectric system is also determined by its breakdown characteristics. A uniform dielectric breakdown characteristic across multiple dielectric systems is advantageous because breakdown of a single dielectric system in a device or circuit can cause undesirable and unpredictable device or circuit operation. Loosely defined, a dielectric breakdown occurs when a voltage applied to a dielectric system exceeds a breakdown voltage limit of the dielectric material as it is arranged in the system. Moreover, the breakdown of a storage dielectric can cause stored charge to undesirably dissipate. Thus, a uniform dielectric breakdown characteristic increases system functionality, reliability, and robustness.

Finally, the quality of a dielectric system is further determined by its ability to permit etch selectivity during fabrication. Etch selectivity refers to an ability to selectively remove material to leave behind a desired pattern. The desired pattern corresponds to the arrangement of materials in a system or device. A material that is not significantly etch selective may pose problems in the fabrication of that system or device, as the material may not permit structural integration with other materials of the device.

In an ongoing effort to develop improved dielectric systems, diligent research and experimentation have highlighted problematic dielectric system characteristics. Known limitations of traditional dielectric material silicon dioxide ($SiO_2$), namely its low K value, high leakage characteristic resulting from increased scaling, and its high temperature chemical impassivity, show the need for improved dielectric materials and systems. Attempts to find improved dielectric materials and systems, as defined by the criteria described above, have had limited success. Particularly, attempts to develop a dielectric system that concurrently satisfies all of the above concerns and issues and that overcomes the limitations of $SiO_2$ have been unsuccessful.

In view of the foregoing, it would be desirable to provide improved dielectric systems.

It would also be desirable to provide methods of fabricating improved dielectric systems.

SUMMARY OF THE INVENTION

It is an object of the present invention to provide improved dielectric systems.

It is also an object of the present invention to provide methods of fabricating improved dielectric systems.

Gate and storage dielectric systems of the present invention provide high effective K values. Improved gate and storage dielectric stacks include a high K dielectric material that produces improved device characteristics such as increased storage capacity and increased drive current. Additionally, the improved dielectric stacks include a passivated overlayer that maintains the high effective K values, in addition to other desirable characteristics. For example, a silicon-rich-nitride passivated overlayer advantageously provides a stoichiometric interface between a dielectric and a substrate or storage plate. In addition, a silicon-rich-nitride passivated overlayer advantageously provides charge control and regulation of threshold voltage in metal-oxide-semiconductor field effect transistors (MOSFETs).

Methods of fabricating improved gate and storage dielectric systems are also provided by the present invention. A substrate or bottom storage plate is carefully prepared before subsequent deposition of metal or, in other embodiments, dielectric material. Metal or dielectric materials are deposited to minimize thickness and to maximize storage capacity. Increased storage capacity, which is also characteristic of high K materials, increases area scaling capabilities. Increased area scaling can reduce the integrated circuit chip area required to fabricate an integrated circuit device. Thus, either more devices can be fabricated on a single integrated circuit chip, advantageously allowing increased functionality, or more integrated circuit chips can be fabricated on a single wafer, advantageously reducing costs.

The passivated overlayer is deposited such that the resulting K value of the overlayer does not compromise the high K value of the dielectric used in the dielectric stack. Dielectric stacks may be appropriately annealed to provide greater stack stability.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention provides improved dielectric systems and methods of their fabrication in which many quality concerns and issues of dielectric systems are preferably concurrently satisfied.

Figure 1:
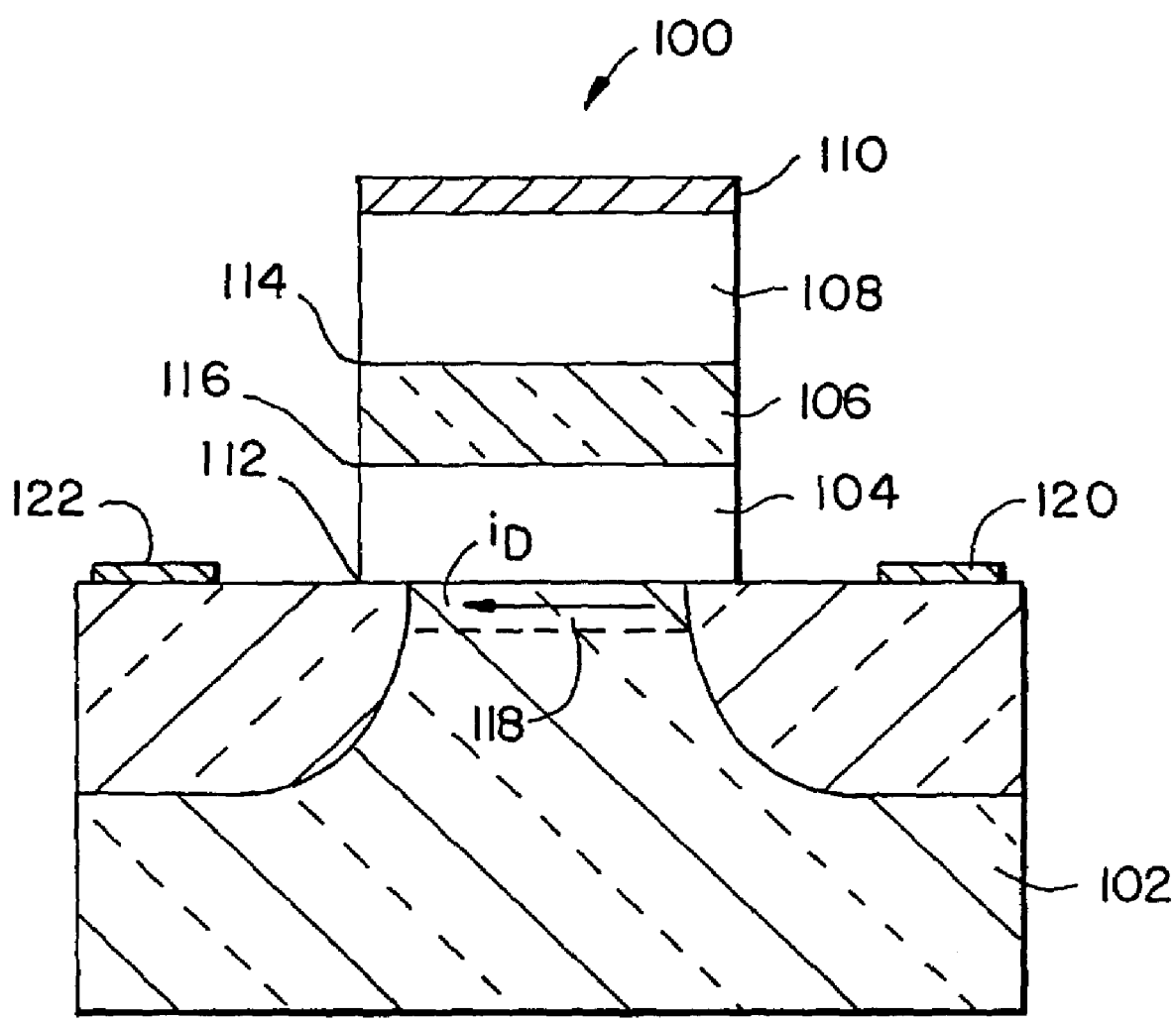
FIG. 1 is a cross-sectional diagram of an exemplary embodiment of a gate dielectric stack according to the invention.

FIG. 1 shows a gate dielectric stack 100 in accordance with the invention. Stack 100 includes substrate 102, gate dielectric 104, passivated overlayer 106, gate 108, and gate electrode 110. Substrate 102 can be one or more semiconductor layers or structures which can include active or operable portions of semiconductor devices. Generally, substrate 102 comprises silicon (Si). Gate 108 can comprise a degenerate heavily doped polysilicon, a metal, or other conductive material.

Gate dielectric 104, which can also be referred to as gate insulator 104, includes a single phase stoichiometrically-uniform-composition material having a high dielectric constant (e.g., $K \geq 10$) or a silicon or transition-metal doped derivative thereof. A single phase stoichiometrically uniform material includes a single material having a consistently precise number of atoms and bonds in a molecule of the material. A transition metal dopant of gate dielectric 104 may be zirconium, tungsten, hafnium, titanium, tantalum, or other suitable transition metal. In particular, gate dielectric 104 is preferably stoichiometric alumina ($Al_2O_3$), which has a K value in the range of about 11 to about 12. Alumina is oxidized aluminum, a metal which can be deposited one atomic layer at a time to form ultra thin metal films (e.g., less than about 3 nm). These metal films are subsequently oxidized in ultra pure oxygen or ozone plasma to produce stoichiometric alumina. Alternatively, gate dielectric 104 can be a composite such as silicon-doped alumina or transition-metal-doped alumina, each typically having a $K > 15$.

A high K dielectric permits greater scalability of a dielectric stack. Scalability of a dielectric stack refers to the ability to reduce the size of the stack. Smaller dielectric stacks preferably allow, among other things, more transistors to be fabricated on an integrated circuit chip, thus allowing more functionality on that chip. Greater scalability of the area occupied by the stack is possible because a high K gate dielectric has a higher dielectric capacitance per unit area ($C_d$) for a fixed dielectric thickness ($t_d$) than a lower K dielectric material, such as traditionally used silicon dioxide ($K \approx 4$). This is shown in the relationship $C_d \propto K/t_d$. A higher dielectric capacitance per unit area corresponds to a higher capacity to store charge, which can compensate for the storage capacity characteristically lost when the area of a dielectric device or system is scaled.

Moreover, because drive current is directly proportional to dielectric capacitance in metal-oxide-semiconductor field effect transistors (MOSFETs), the increased dielectric capacitance per unit area provided by a high K dielectric provides increased drive current. Drive current can be generally defined as the current flowing through induced channel 118 from drain electrode 120 to source electrode 122 when, in the presence of sufficient potential between drain electrode 120 and source electrode 122, a voltage equal to or greater than the threshold voltage of the MOSFET device is applied to the gate. A low K dielectric material in gate dielectric 104 may not provide sufficient drive current, even when the thickness of gate dielectric 104 is scaled. Thus, to provide sufficient drive current, a high K dielectric is often required.

The scalability of high K gate dielectric 104 is but one consideration when evaluating the quality of a dielectric system. Because gate dielectric 104 forms interface 112 with substrate 102, the gate dielectric material should also be chemically compatible with the substrate material.

Alumina, when used as gate dielectric 104, is chemically compatible with a silicon substrate 102. However, the combination of the two materials does not inherently provide a stoichiometric interface at interface 112. During device fabrication, hydroxide ions can cause undesirable and non-stoichiometric formation of alumino-silicate ($Al_xSi_yO_z$) at interface 112. The hydroxide ions may be absorbed into a silicon substrate or plate in the form of $Si_xO_yH_z$ and may be naturally present due to exposure of the substrate or plate to open air or to ambient hydroxide. Alumino-silicate formed at interface 112 can have an undesirably lower K value than the stoichiometric alumina gate dielectric, producing an undesirably lower effective K value for the dielectric stack. Moreover, known fabrication methods may result in uncontrollable and incomplete alumino-silicate bonding at interface 112.

Incomplete bonding at interface 112 can cause an undesirable accumulation of fixed negative charge at interface 112. This may result in an undesirable increase in the threshold voltage of the device. In particular, dangling atoms from the dielectric material of gate dielectric 104 (i.e., atoms that have not formed bonds) and from substrate 102 may contribute to the undesirable fixed interface charge accumulation at interface 112.

Figure 2:
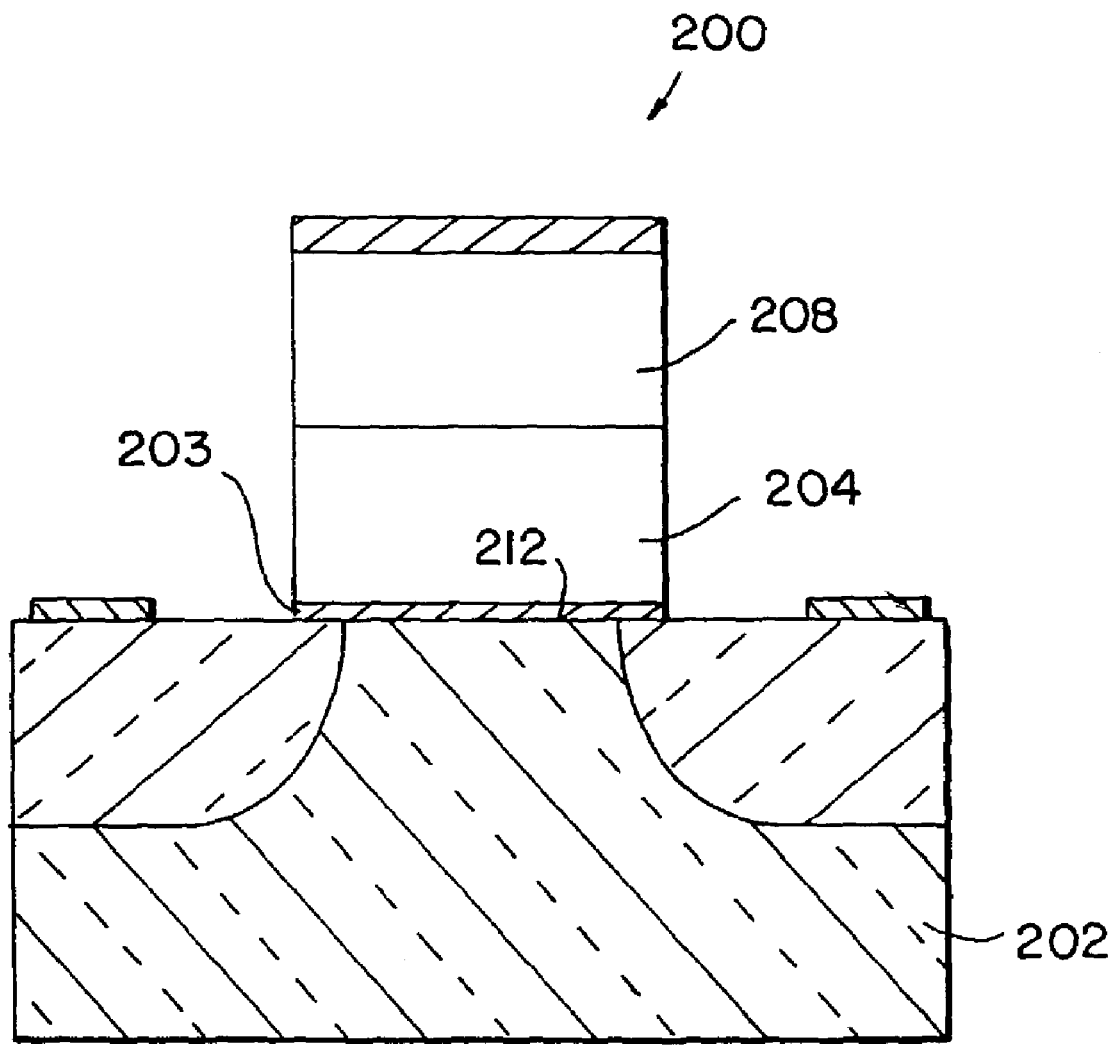
FIG. 2 is a cross-sectional diagram of a known gate dielectric stack.

Passivated overlayer 106 advantageously prevents dopant used in gate 108 from readily diffusing through high K gate dielectric 104 to form bonds at interface 112. This dopant diffusion phenomenon may be especially evident at high temperatures common during device fabrication. For example, as shown in FIG. 2, the combination of a phosphorus-doped silicon gate 208 deposited directly upon alumina gate dielectric 204 causes the formation of an alumino-phospho-silicate layer 203 at interface 212. Interface 212 may have originally been less of an uncorrupted interface between gate dielectric 204 and silicon substrate 202 before high temperature fabrication caused phosphorous dopant diffusion through gate dielectric 204.

Alumino-phospho-silicate layer 203 may contribute to negative charge buildup ($Q_f$) at interface 212. The known device of FIG. 2 generally has a fixed $Q_f \approx 3e+13$ (i.e., that is $Q_f \approx 3 \times 10^{13}$) fundamental charge units per $cm^2$. One fundamental charge unit is equal to about 1.60218e-19 coulombs. As described above, a fixed charge accumulation in the dielectric material undesirably causes an increase in the threshold voltage. Because dopant diffusion through gate dielectric 204 may be uncontrollable, formation of alumino-phospho-silicate layer 203 may be uncontrollable. Consequently, the negative charge at interface 212, and the threshold voltage of any device that uses this known stack, may be uncontrollable and may undesirably vary from device to device.

Alumino-phospho-silicate layer 203 may also have a lower K value than that of gate dielectric 204. This causes an undesirable lowering of the effective K value of the dielectric stack. Again, this would adversely affect at least one of the advantages of having a high K value, namely scalability.

Returning to FIG. 1, passivated overlayer 106 forms chemically inert interface 114 with gate 108 and forms chemically inert interface 116 with gate dielectric 104. A chemically inert interface is an interface at which no substantial bonding occurs between the materials forming the interface.

Passivated overlayer 106 preferably provides high temperature chemical passivity in dielectric stack 100. In particular, passivated overlayer 106 prevents diffusion of dopant from gate 108 through gate dielectric 104, which would subsequently corrupt interface 112 and lower the effective K value of the stack. Passivated overlayer 106 thus prevents additional fixed charge formation. Consequently, the combination of the contaminant protection of passivated overlayer 106 and the stoichiometry of interface 112 provides a reduced interface charge in the device of FIG. 1. Stack 100 advantageously has a fixed $Q_f$ approximately $\leq 3e+10$ fundamental charge units per $cm^2$, which is significantly less than the typical fixed interface charge of known devices of $Q_f \approx 3e+13$ fundamental charge units per $cm^2$.

In addition, passivated overlayer 106 preferably provides uniformity in the dielectric breakdown voltage limit of the dielectric stack. The contaminant protection provided by passivated overlayer 106 prevents local (i.e., geometrically small) defects in gate dielectric 104 that contribute to a lower dielectric breakdown voltage. Moreover, in the absence of passivated overlayer 106, uncontrollable dopant diffusion into gate dielectric 104 may likely result in an undesirably uncontrollable and varying threshold voltage.

Further, passivated overlayer 106 preferably provides uniform injection of either electrons or holes from gate 108 into gate dielectric 104 when a voltage is applied to gate electrode 110. The injection of electrons or holes corresponds respectively to either an n-type or p-type gate 108. Passivated overlayer 106 thus improves reliability and uniformity in gate dielectric stack 100.

Passivated overlayer 106 is preferably "injector" silicon-rich-nitride (SRN), which is an SRN with a refractive index of about 2.5 or greater, and preferably has a thickness in the range of about 0.5 to about 3.0 nm. Injector SRN can be characterized as a two phase insulator consisting of uniformly distributed silicon nano crystals in a body of stoichiometric nitride. A refractive index of about 2.5 or greater provides passivated overlayer 106 with a dielectric constant comparable to or greater than that of a high K gate dielectric 104. Particularly, injector SRN has a dielectric constant that is greater than or equal to 12, which is the K value of silicon. Thus, the benefits of a high K gate dielectric 104, as described above, are not canceled by the addition of passivated overlayer 106. Alternatively, passivated overlayer 106 can be an SRN with a refractive index of less than about 2.5; however, a maximum K and the benefits associated therewith in a dielectric stack are achieved when the refractive index is greater than about 2.5.

Figure 3:
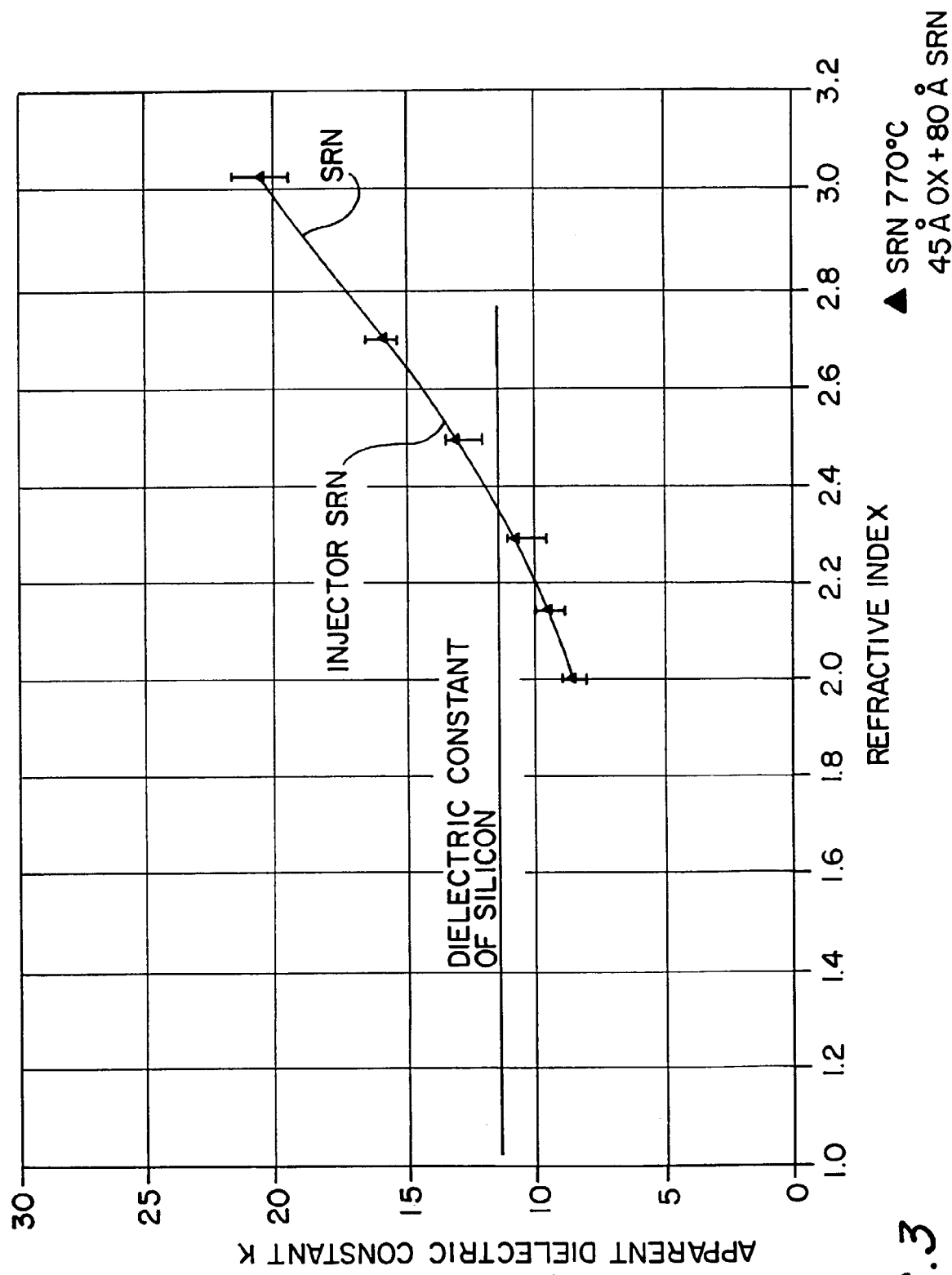
FIG. 3 is a graph of dielectric constants versus refractive indices of silicon-rich-nitride.

FIG. 3 illustrates the relationship between the refractive indices and dielectric constants K of injector SRN. As shown, injector SRN with a refractive index of about 2.5 or greater provides a K value greater than about 12, which is the dielectric constant of silicon.

Figure 4:
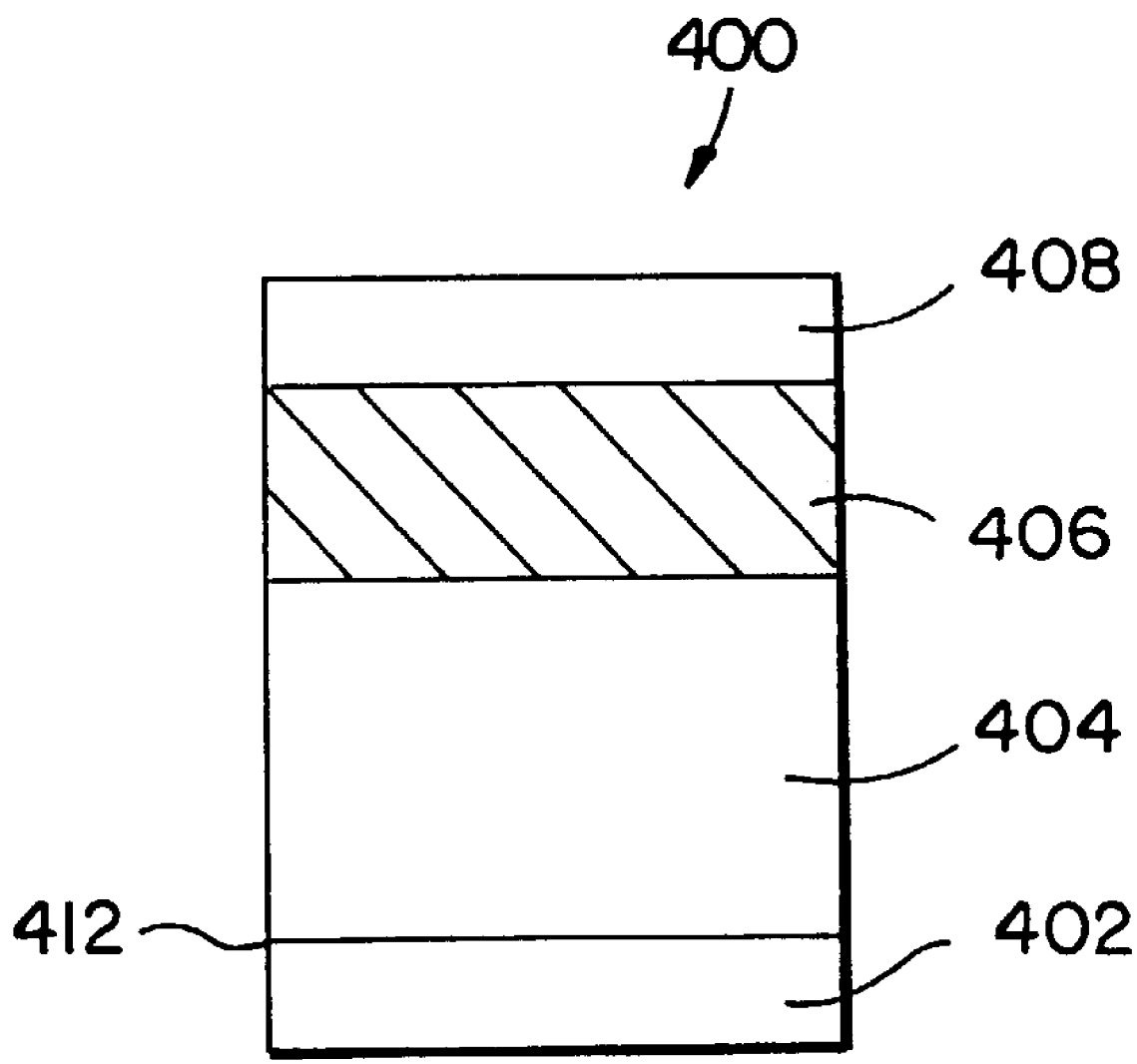
FIG. 4 is a cross-sectional diagram of an exemplary embodiment of a storage dielectric stack according to the invention.

FIG. 4 shows a storage dielectric stack 400 in accordance with the invention. Stack 400 includes bottom plate 402, storage dielectric 404, passivated overlayer 406, and top plate 408. Bottom plate 402 and top plate 408 can be a degenerate heavily doped silicon, a doped polysilicon material, a metal, or other conductive material.

Storage dielectric 404 is preferably the same material as that of gate dielectric 104, namely alumina or a doped derivative of alumina. As previously described, alumina is oxidized aluminum, a metal which can be deposited in ultra thin metal films (e.g., less than about 3 nm) and subsequently oxidized in ultra pure oxygen or ozone plasma to produce stoichiometric is alumina. A high K dielectric value (e.g., K≧10) in storage dielectric 404 provides a higher storage capacity, which is advantageous in memory devices such as DRAMS (dynamic random access memories). High storage capacity in high K dielectrics results from the high capacitance per unit area provided by high K dielectrics, as previously described.

Passivated overlayer 406 is preferably the same material as that of passivated overlayer 106, namely injector SRN or SRN, and preferably serves the same or similar purposes in the stack. In particular, passivated overlayer 406 prevents diffusion of dopant from top plate 408 through storage dielectric 404. Passivated overlayer 406 provides uniform injection of electrons or holes from top plate 408 into storage dielectric 404 during voltage stress and provides uniform dielectric breakdown in storage dielectric 404. Passivated overlayer 406 preferably has the same range of thickness (i.e., about 0.5 to about 3 nm) and refractive index (i.e., 2 about 2.5) as passivated overlayer 106. The fixed charge ($Q_f$) at interface 412 is advantageously about the same as in gate dielectric stack 100, namely $Q_f$ approximately $\leq$3e+10 units of fundamental charge per cm$^2$.

Figure 5:
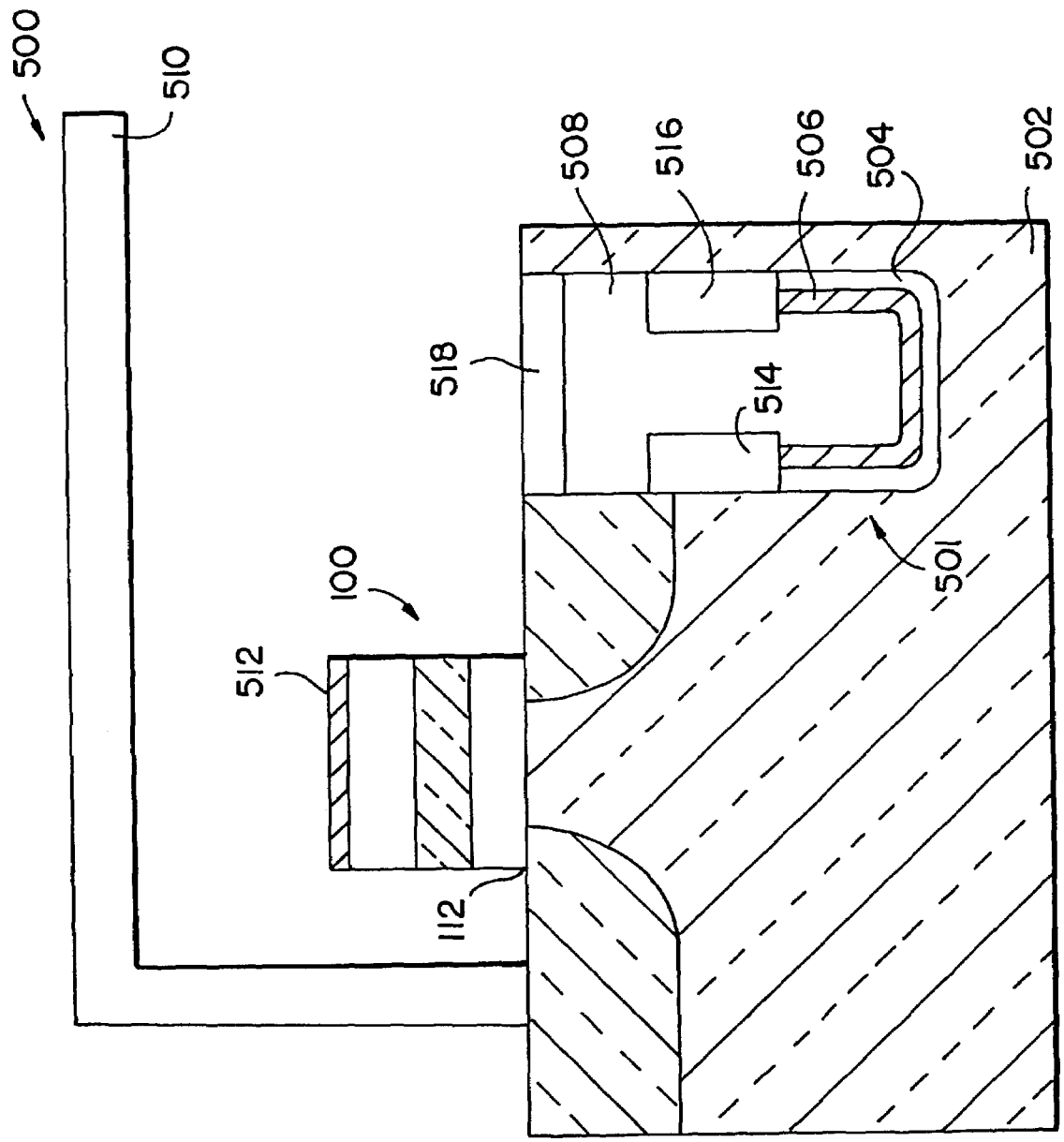
FIGS. 5 and 6 are cross-sectional diagrams of improved integrated circuit devices using the dielectric stacks of the invention.

FIG. 5 shows an integrated circuit device 500 using the dielectric stacks of the invention. Device 500 is an embodiment of a deep trench storage capacitor DRAM cell that includes embodiments of the gate and storage dielectric stacks of the invention. Storage (capacitor) dielectric stack 501 includes bottom plate/substrate 502, storage dielectric 504, passivated overlayer 506, and top plate 508. A logic data bit is written into storage dielectric stack 501 via bit line 510 when sufficient voltage is applied to bit line 510 and the voltage at word line 512 (i.e., at the gate electrode) rises above the threshold voltage of gate dielectric stack 100. Conversely, a logic data bit is read from storage dielectric stack 501 via bit line 510 when insufficient voltage is applied to bit line 510 and the voltage at word line 512 rises above the threshold voltage of gate dielectric stack 100. Oxide 514, oxide 516, and oxide 518 isolate storage dielectric stack 501. Improved device characteristics of device 500 are obtained from gate dielectric stack 100 and storage dielectric stack 501. For example, stoichiometric interface 112 provides a desirable lower threshold voltage for performing both read and write operations. Also, the improved charge storage capacity of storage dielectric stack 501 enhances memory capacity and reliability.

Figure 6:
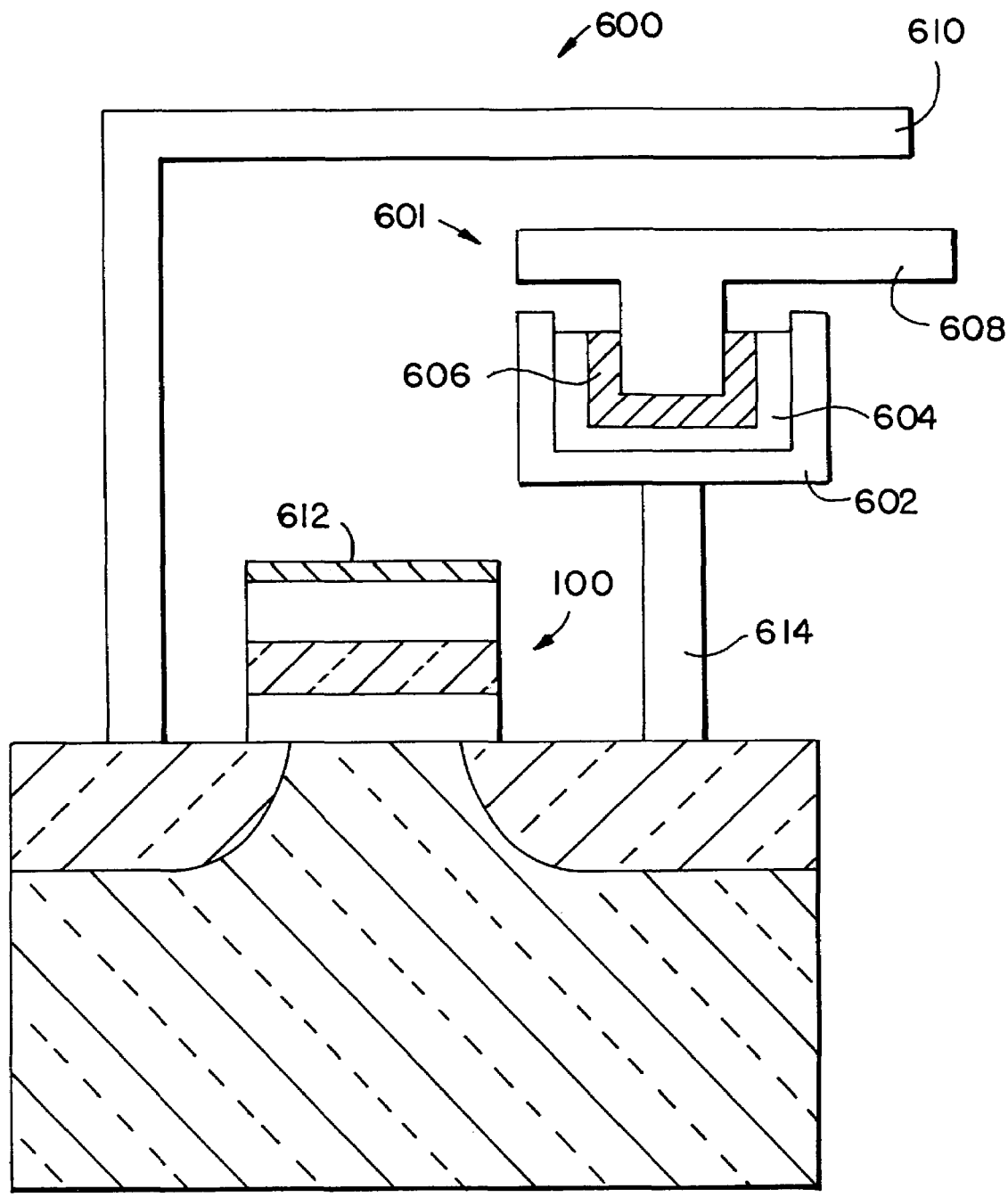

Similarly, FIG. 6 shows another embodiment of an improved DRAM capacitor device using the dielectric stacks of the invention. Device 600 is a stacked capacitor DRAM cell that includes gate dielectric stack 100 and storage (capacitor) dielectric stack 601 in accordance with the invention. Storage dielectric stack 601 includes bottom plate 602, storage dielectric 604, passivated overlayer 606, and top plate 608. Operation of device 600 is similar to that of device 500. A logic data bit is written into storage dielectric stack 601 via bit line 610 when sufficient voltage is applied to bit line 610 and the voltage at word line 612 (i.e., at the gate electrode) rises above the threshold voltage of gate dielectric stack 100. Conversely, a logic data bit is read from storage dielectric stack 601 via bit line 610 when insufficient voltage is applied at bit line 610 and the voltage at word line 612 rises above the threshold voltage of gate dielectric stack 100. Current flows through electrical contact 614 as storage dielectric stack 601 charges and discharges. The improved characteristics of device 600 are similar to those of is device 500 and are similarly obtained from the dielectric stacks of the invention.

Figure 7:
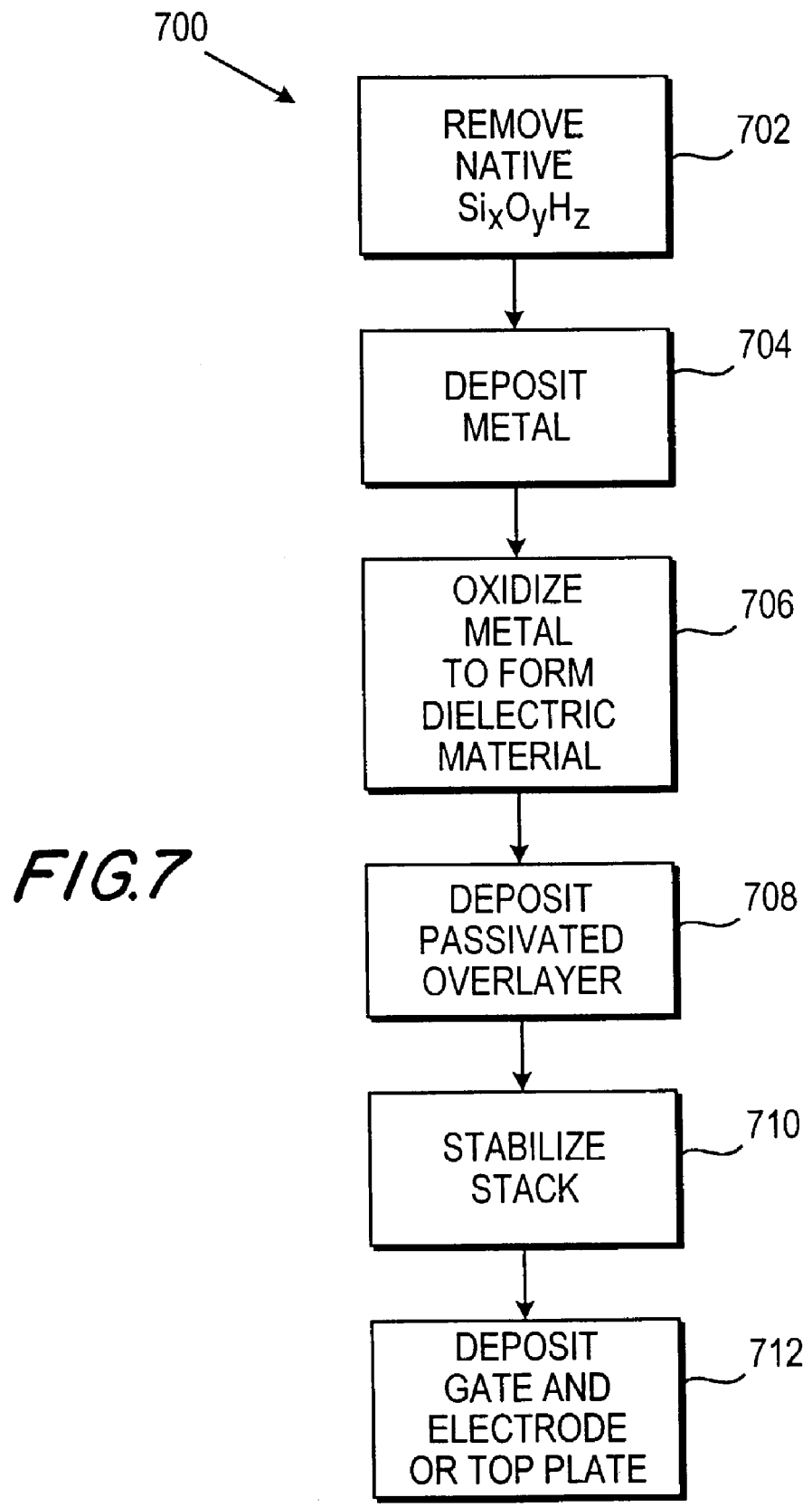
FIG. 7 is a flowchart of an exemplary embodiment of a method of fabricating a dielectric stack according to the invention.

The gate and storage dielectric stacks of FIGS. 1 and 4–6 can be fabricated by the method shown in FIG. 7 in accordance with the invention. Process 700 begins at 702 by first preparing the silicon substrate or silicon bottom plate of a dielectric stack. Native radical hydroxide ions (OH$^-$) are removed from at least a portion of the surface of, for example, silicon substrate 102 or silicon bottom plate 402. Hydroxide ions may be present in bonds of silicon and silicon hydroxide ($Si_xO_yH_z$) that can form naturally in silicon exposed to open air or to ambient hydroxide. If not removed, these radical hydroxide ions may react with a metal-derived gate dielectric material and substrate material, or a metal-derived storage dielectric material and bottom plate material, to form nonstoichiometric bonding. For example, radical hydroxide ions may react with aluminum and silicon to form a nonstoichiometric $Al_xSi_yO_z$ material. The removal of OH$^-$ involves controllably introducing a hydrofluoric acid (HF) vapor in an ultra pure nitrogen bleed-in, while maintaining sufficient vacuum. Generally, a vacuum of approximately less than about $10^{-6}$ torr is sufficient and can be maintained in a high vacuum chamber.

Next, at 704, a single atomic layer of a metal is deposited on the prepared substrate or bottom plate. The metal is preferably aluminum, subsequently oxidized using a controlled amount of ultra pure oxygen or ozone plasma to form stoichiometric alumina at step 706. Oxidation may be followed by an appropriate anneal (not shown) to stabilize the dielectric stack. Steps 704 and 706 are preferably repeated until a desired thickness of alumina is obtained. Aluminum may be deposited by atomic layer deposition ("ALD"), molecular bean epitaxy ("MBE"), electron beam evaporation, sputtering, or any other suitable method. This procedure should be performed in a vacuum or in a high partial pressure of dry nitrogen gas ($N_2$) to ensure that no undesirable OH$^-$ ions are in the environment.

Figure 8:
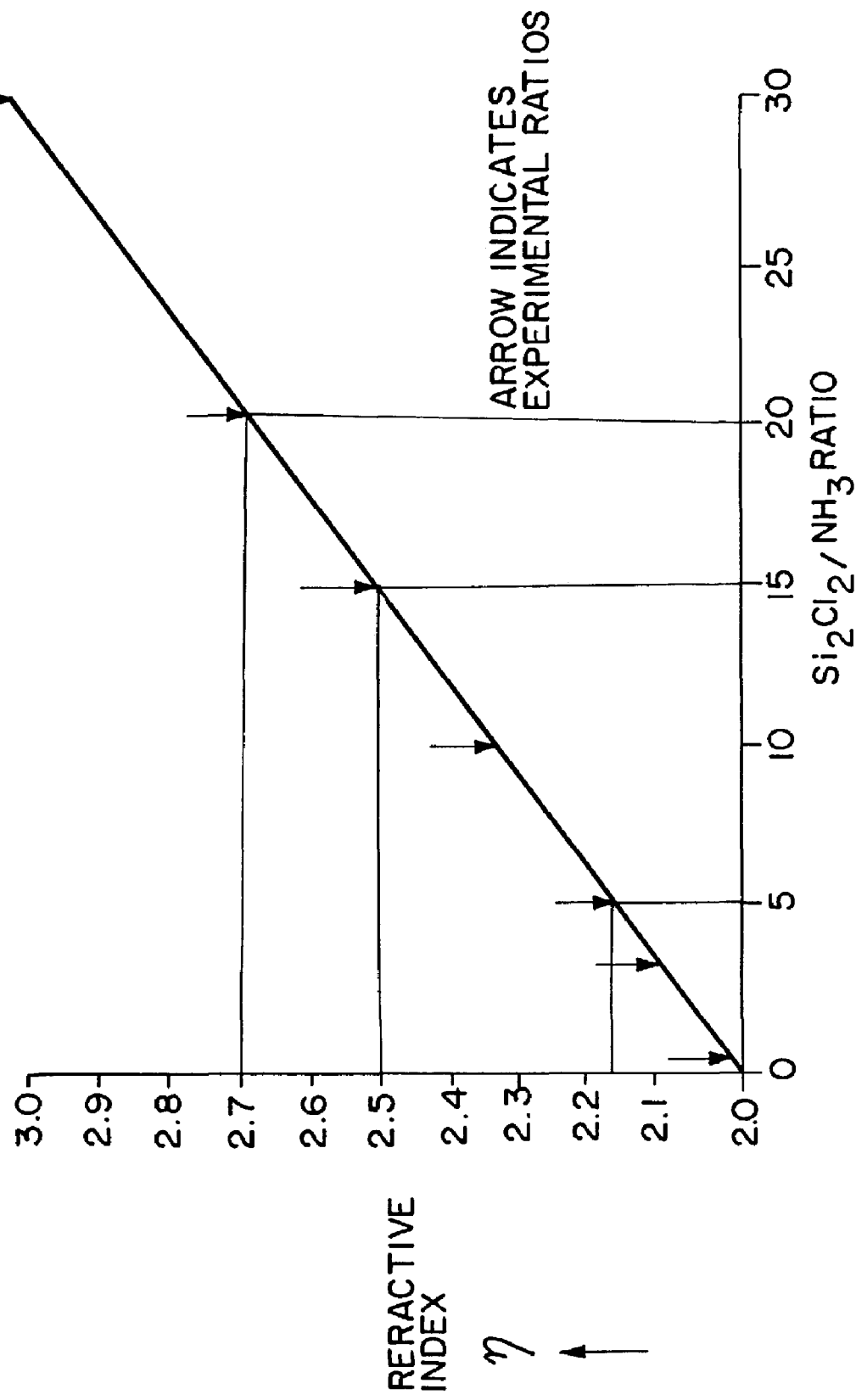
FIG. 8 is a graph of refractive indices of silicon-rich-nitride versus ratios of dichlorosilane-to-ammonia used in the fabrication of silicon-rich-nitride.

Next, at 708, a passivated overlayer is deposited on the dielectric material. The passivated overlayer is preferably silicon-rich-nitride (SRN) and is preferably deposited in a layer ranging from about 0.5 to about 3.0 nm in thickness. The SRN preferably has a refractive index of $\geq$2.5. Passivated overlayer deposition can be accomplished by a low pressure plasma enhanced chemical vapor deposition process with silane ($SiH_4$) or dichlorosilane ($SiH_2Cl_2$), ammonia ($NH_3$), and nitrogen such that the ratio of $SiH_4$ to $NH_3$, or $SiH_2Cl_2$ to $NH_3$, is approximately $\geq$15. This ratio regulates the amount and distribution of each phase of the silicon-rich-nitride, namely the amount and distribution of the silicon nitride insulator ($Si_3N_4$) and either crystalline or amorphous silicon (Si) particles. The ratio of $SiH_2Cl_2$ to $NH_3$ has been found to be directly proportional to the refractive index of the resulting SRN material, as shown in FIG. 8. Thus, control of the $SiH_2Cl_2/NH_3$ ratio is important. For example, a $SiH_2Cl_2/NH_3$ ratio of 15 produces a SRN material with a refractive index of approximately 2.5, a value that ensures a K>12. As noted previously, a deposited SRN material should preferably have a K value similar to that of the high K dielectric material, such that the advantages of the high K dielectric material are not canceled out by a passivated overlayer with a low K value.

Returning to FIG. 7, the dielectric stack may then be stabilized by a rapid thermal anneal in nitrogen at 710. A gate and gate electrode, or top plate, are deposited at 712, depending on whether a gate dielectric stack or a storage dielectric stack is being fabricated.

If a storage capacitor is being fabricated, step 708 can be optionally eliminated. That is, a passivated overlayer may not need to be included in a storage dielectric stack fabricated in accordance with the invention. Process 700 without 708 may be sufficient to achieve an improved storage capacitor stack. However, a passivated overlayer in a storage dielectric stack provides a preferably maximum achievable K value and consequently higher storage capacity.

In another embodiment of a method to fabricate dielectric stacks in accordance with the invention, 704 involves depositing metal to a desired thickness and then subsequently oxidizing the entire thickness in a controlled manner to form the desired stoichiometric dielectric material. For example, aluminum may first be deposited to the desired thickness and then oxidized to form stoichiometric alumina.

Figure 9:
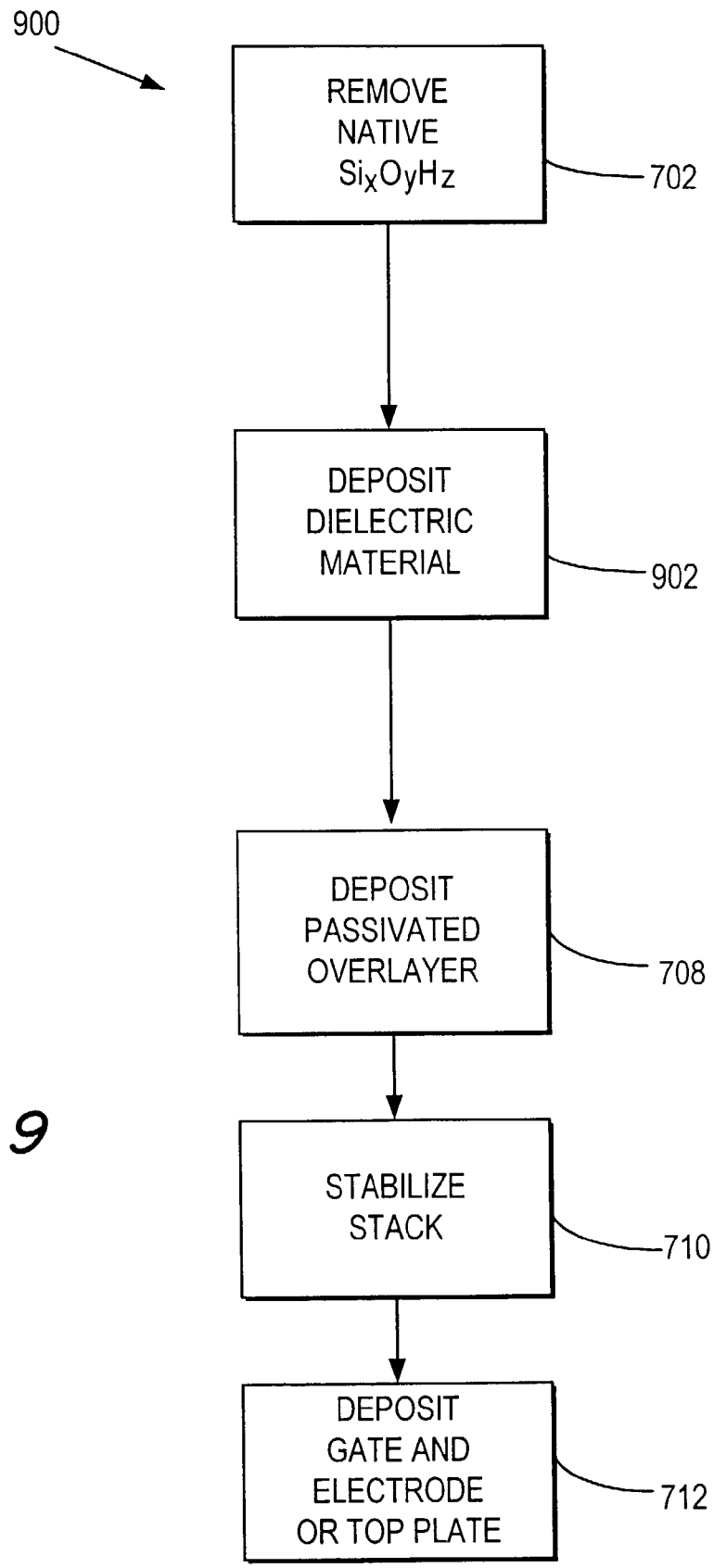
FIG. 9 is a flowchart of another exemplary embodiment of a method of fabricating a dielectric stack according to the invention.

FIG. 9 shows yet another embodiment of a method to fabricate improved dielectric stacks in accordance with the invention. In process 900, 704 and 706 of process 700 are replaced by 902. At 902, a dielectric material is deposited directly on a prepared substrate or bottom plate. The dielectric material if preferably alumina and may be deposited by MBE, sputtering, or any other suitable method.

Thus it is seen that improved gate and storage dielectric systems, and methods of their fabrication, are provided. One skilled in the art will appreciate that the present invention can be practiced by other than the described embodiments, which are presented for purposes of illustration and not of limitation, and the present invention is limited only by the claims which follow.

I claim:

1. A gate dielectric stack used in integrated circuit devices, said stack comprising:
   a substrate;
   a high K gate dielectric having a first and a second surface, said second surface forming an interface with said substrate, said interface having a charge no greater than about 3e+10 fundamental charge units per $cm^2$, wherein said K is a dielectric constant;
   a gate; and
   a passivated overlayer having a first and a second surface, said second surface of said passivated overlayer forming a first chemically inert interface with said first surface of said high K gate dielectric, said first surface of said passivated overlayer forming a second chemically inert interface with said gate, said passivated overlayer having a dielectric constant substantially equal to or greater than the dielectric constant of said high K gate dielectric.

2. The gate dielectric stack of claim 1 wherein said substrate comprises silicon.

3. The gate dielectric stack of claim 1 wherein said high K gate dielectric has a K greater than about 10.

4. The gate dielectric stack of claim 1 wherein said high K gate dielectric comprises alumina.

5. The gate dielectric stack of claim 4 wherein said high K gate dielectric has a K in the range of about 11 to about 12.

6. The gate dielectric stack of claim 1 wherein said high K gate dielectric has a K greater than about 15.

7. The gate dielectric stack of claim 1 wherein said high K gate dielectric comprises alumina doped with a dopant.

8. The gate dielectric stack of claim 7 wherein said dopant is selected from the group consisting of silicon and a transition metal.

9. The gate dielectric stack of claim 8 wherein said transition metal is selected from the group consisting of zirconium, tungsten, hafnium, titanium, and tantalum.

10. The gate dielectric stack of claim 1 wherein said gate comprises material selected from the group consisting of degenerate heavily doped polysilicon and metal.

11. The gate dielectric stack of claim 1 wherein said passivated overlayer comprises silicon-rich-nitride.

12. The gate dielectric stack of claim 11 wherein said silicon-rich-nitride comprises uniformly distributed silicon nano crystals in a body of stoichiometric nitride and has a refractive index of greater than about 2.5.

13. The gate dielectric stack of claim 11 wherein said passivated overlayer has a thickness in the range of about 0.5 to about 3 nm.

14. A storage dielectric stack used in integrated circuit devices, said stack comprising:
    a first plate;
    a high K storage dielectric having a first and a second surface, said second surface forming an interface with said first plate, said interface having a charge no greater than about 3e+10 fundamental charge units per $cm^2$, wherein said K is a dielectric constant;
    a second plate; and
    a passivated overlayer having a first and a second surface, said second surface of said passivated overlayer forming a first chemically inert interface with said first surface of said high K storage dielectric, said first surface of said passivated overlayer forming a second chemically inert interface with said second plate, said passivated overlayer having a dielectric constant substantially equal to or greater than the dielectric constant of said high K storage dielectric.

15. The storage dielectric stack of claim 14 wherein said first plate comprises degenerate heavily doped silicon.

16. The storage dielectric stack of claim 14 wherein said high K storage dielectric has a K greater than about 10.

17. The storage dielectric stack of claim 14 wherein said high K storage dielectric comprises alumina.

18. The storage dielectric stack of claim 17 wherein said high K storage dielectric has a K in the range of about 11 to about 12.

19. The storage dielectric stack of claim 14 wherein said high K storage dielectric has a K greater than about 15.

20. The storage dielectric stack of claim 14 wherein said high K storage dielectric comprises alumina doped with a dopant.

21. The storage dielectric stack of claim 20 wherein said dopant is selected from the group consisting of silicon and a transition metal.

22. The storage dielectric stack of claim 21 wherein said transition metal is selected from the group consisting of zirconium, tungsten, hafnium, titanium, and tantalum.

23. The storage dielectric stack of claim 14 wherein said second plate comprises material selected from the group consisting of doped polysilicon and metal.

24. The storage dielectric stack of claim 14 wherein said passivated overlayer comprises silicon-rich-nitride.

25. The storage dielectric stack of claim 24 wherein said silicon-rich-nitride comprises uniformly distributed silicon nano crystals in a body of stoichiometric nitride and has a refractive index of greater than about 2.5.

26. The storage dielectric stack of claim 24 wherein said passivated overlayer has a thickness in the range of about 0.5 to about 3 nm.

27. A gate dielectric stack used in integrated circuit devices, said stack comprising:
    a substrate;
    an alumina gate dielectric having a first and a second surface, said second surface forming an interface with the substrate;
    a gate; and
    a silicon-rich-nitride overlayer having a first and a second surface, said second surface of said silicon-rich-nitride overlayer forming a first chemically inert interface with said first surface of said alumina gate dielectric, said first surface of said silicon-rich-nitride overlayer forming a second chemically inert interface with said gate, said silicon-rich-nitride overlayer having a dielectric constant substantially equal to or greater than the dielectric constant of said alumina gate dielectric.

28. The gate dielectric stack of claim 27 wherein said substrate comprises silicon.

29. The gate dielectric stack of claim 27 wherein said alumina gate dielectric has a dielectric constant in the range of about 11 to about 12.

30. The gate dielectric stack of claim 27 wherein said alumina gate dielectric is doped with a dopant.

31. The gate dielectric stack of claim 30 wherein said dopant is selected from the group consisting of silicon and a transition metal.

32. The gate dielectric stack of claim 27 wherein said silicon-rich-nitride overlayer has a refractive index of greater than about 2.5.

33. The gate dielectric stack of claim 27 wherein said silicon-rich-nitride overlayer has a thickness in the range of about 0.5 to about 3 nm.

34. The gate dielectric stack of claim 27 wherein said interface has a charge no greater than about 3e+10 fundamental charge units per $cm^2$.

35. A storage dielectric stack used in integrated circuit devices, said stack comprising:
a first plate;
an alumina storage dielectric having a first and a second surface, said second surface forming an interface with said first plate;
a second plate; and
a silicon-rich-nitride overlayer having a first and a second surface, said second surface of said silicon-rich-nitride overlayer forming a first chemically inert interface with said first surface of said alumina storage dielectric, said first surface of said silicon-rich-nitride overlayer forming a second chemically inert interface with said second plate, said silicon-rich-nitride overlayer having a dielectric constant substantially equal to or greater than the dielectric constant of said alumina storage dielectric.

36. The storage dielectric stack of claim 35 wherein said first plate comprises degenerate heavily doped silicon.

37. The storage dielectric stack of claim 35 wherein said alumina storage dielectric has a dielectric constant in the range of about 11 to about 12.

38. The storage dielectric stack of claim 35 wherein said alumina storage dielectric is doped with a dopant.

39. The storage dielectric stack of claim 38 wherein said dopant is selected from the group consisting of silicon and a transition metal.

40. The storage dielectric stack of claim 35 wherein said silicon-rich-nitride overlayer layer has a refractive index of greater than about 2.5.

41. The storage dielectric stack of claim 35 wherein said silicon-rich-nitride overlayer has a thickness in the range of about 0.5 to about 3 nm.

42. The storage dielectric stack of claim 35 wherein said interface has a charge no greater than about 3e+10 fundamental charge units per $cm^2$.

43. A gate dielectric stack used in integrated circuit devices, said stack comprising:
a substrate;
an alumina gate dielectric having a first and a second surface, said second surface forming an interface with said substrate, said alumina gate dielectric having a K in the range of about 11 to about 12, said K being a dielectric constant, said interface having a charge no greater than about 3e+10 fundamental charge units per $cm^2$;
a gate; and
a silicon-rich-nitride overlayer having a first and a second surface, said second surface of said silicon-rich-nitride overlayer forming a first chemically inert interface with said first surface of said alumina gate dielectric, said first surface of said silicon-rich-nitride overlayer forming a second chemically inert interface with said gate, said silicon-rich-nitride overlayer having a refractive index greater than or equal to about 2.5, said silicon-rich-nitride overlayer having a K substantially equal to or greater than the K of said alumina gate dielectric, said silicon-rich-nitride layer having a thickness in the range of about 0.5 to about 3 nm.

44. The gate dielectric stack of claim 43 wherein said alumina gate dielectric is doped with a dopant.

45. The gate dielectric stack of claim 44 wherein said dopant is selected from the group consisting of silicon and a transition metal.

46. A storage dielectric stack used in integrated circuits, said stack comprising:
a first plate;
an alumina storage dielectric having a first and a second surface, said second surface forming an interface with said first plate, said interface having a charge no greater than about 3e+10 fundamental charge units per $cm^2$;
a second plate; and
a silicon-rich-nitride overlayer having a first and a second surface, said second surface of said silicon-rich-nitride overlayer forming a first chemically inert interface with said first surface of said alumina storage dielectric, said first surface of said silicon-rich-nitride overlayer forming a second chemically inert interface with said second plate, said silicon-rich-nitride overlayer having a refractive index greater than or equal to about 2.5, said silicon-rich-nitride overlayer having a dielectric constant substantially equal to or greater than the dielectric constant of said alumina storage dielectric, said silicon-rich-nitride layer having a thickness in the range of about 0.5 to about 3 nm.

47. The storage dielectric stack of claim 46 wherein said alumina storage dielectric is doped with a dopant.

48. The storage dielectric stack of claim 47 wherein said dopant is selected from the group consisting of silicon and a transition metal.

49. A gate dielectric stack used in integrated circuit devices, said stack comprising:
a substrate having a region from which native $Si_xO_yH_z$ has been removed;
a high K gate dielectric having a first and a second surface, said second surface forming an interface with said region of said substrate, wherein said K is a dielectric constant;
a gate; and
a passivated overlayer of silicon-rich-nitride having a first and a second surface, said second surface of said passivated overlayer forming a first chemically inert interface with said first surface of said high K gate dielectric, said first surface of said passivated overlayer forming a second chemically inert interface with said gate, said passivated overlayer having a dielectric constant substantially equal to or greater than the dielectric constant of said high K gate dielectric.

50. The gate dielectric stack of claim 49 wherein said substrate comprises silicon.

51. The gate dielectric stack of claim 49 wherein said high K gate dielectric has a K greater than about 10.

52. The gate dielectric stack of claim 49 wherein said high K gate dielectric comprises alumina.

53. The gate dielectric stack of claim 52 wherein said high K gate dielectric has a K in the range of about 11 to about 12.

54. The gate dielectric stack of claim 49 wherein said high K gate dielectric has a K greater than about 15.

55. The gate dielectric stack of claim 49 wherein said high K gate dielectric comprises alumina doped with a dopant.

56. The gate dielectric stack of claim 55 wherein said dopant is selected from the group consisting of silicon and a transition metal.

57. The gate dielectric stack of claim 56 wherein said transition metal is selected from the group consisting of zirconium, tungsten, hafnium, titanium, and tantalum.

58. The gate dielectric stack of claim 49 wherein said gate comprises material selected from the group consisting of degenerate heavily doped polysilicon and metal.

59. The gate dielectric stack of claim 49 wherein said silicon-rich-nitride has a refractive index of greater than about 2.5.

60. The gate dielectric stack of claim 49 wherein said passivated overlayer has a thickness in the range of about 0.5 to about 3 nm.

61. The gate dielectric stack of claim 49 wherein said interface has a charge no greater than about 3e+10 fundamental charge units per cm$^2$.

62. A storage dielectric stack used in integrated circuit devices, said stack comprising:
a first plate having a region from which native $Si_xO_yH_z$ has been removed;
a high K storage dielectric having a first and a second surface, said second surface forming an interface with said region of said first plate, wherein said K is a dielectric constant;
a second plate; and
a passivated overlayer of silicon-rich-nitride having a first and a second surface, said second surface of said passivated overlayer forming a first chemically inert interface with said first surface of said high K storage dielectric, said first surface of said passivated overlayer forming a second chemically inert interface with said second plate, said passivated overlayer having a dielectric constant substantially equal to or greater than the dielectric constant of said high K storage dielectric.

63. The storage dielectric stack of claim 62 wherein said first plate comprises degenerate heavily doped silicon.

64. The storage dielectric stack of claim 62 wherein said high K storage dielectric has a K greater than about 10.

65. The storage dielectric stack of claim 62 wherein said high K storage dielectric comprises alumina.

66. The storage dielectric stack of claim 65 wherein said high K storage dielectric has a K in the range of about 11 to about 12.

67. The storage dielectric stack of claim 62 wherein said high K storage dielectric has a K greater than about 15.

68. The storage dielectric stack of claim 62 wherein said high K storage dielectric comprises alumina doped with a dopant.

69. The storage dielectric stack of claim 68 wherein said dopant is selected from the group consisting of silicon and a transition metal.

70. The storage dielectric stack of claim 69 wherein said transition metal is selected from the group consisting of zirconium, tungsten, hafnium, titanium, and tantalum.

71. The storage dielectric stack of claim 62 wherein said second plate comprises material selected from the group consisting of doped polysilicon and metal.

72. The storage dielectric stack of claim 62 wherein said silicon-rich-nitride has a refractive index of greater than about 2.5.

73. The storage dielectric stack of claim 62 wherein said passivated overlayer has a thickness in the range of about 0.5 to about 3 nm.

74. The storage dielectric stack of claim 62 wherein said interface has a charge no greater than about 3e+10 fundamental charge units per cm$^2$.

* * * * *